US006762072B2

(12) United States Patent
Lutz

(10) Patent No.: US 6,762,072 B2
(45) Date of Patent: Jul. 13, 2004

(54) SI WAFER-CAP WAFER BONDING METHOD USING LOCAL LASER ENERGY, DEVICE PRODUCED BY THE METHOD, AND SYSTEM USED IN THE METHOD

(75) Inventor: Markus Lutz, Sunnyvale, CA (US)

(73) Assignee: Robert Bosch GmbH, Stuttgart (DE)

( * ) Notice: Subject to any disclaimer, the term of this patent is extended or adjusted under 35 U.S.C. 154(b) by 210 days.

(21) Appl. No.: 10/092,890

(22) Filed: Mar. 6, 2002

(65) Prior Publication Data
US 2003/0170966 A1 Sep. 11, 2003

(51) Int. Cl.[7] .............................................. H01L 21/00
(52) U.S. Cl. ........................ 438/53; 438/50; 438/107
(58) Field of Search ............................ 438/107, 53, 50, 438/33, 113

(56) References Cited

U.S. PATENT DOCUMENTS

| | | | | |
|---|---|---|---|---|
| 5,483,095 A | * | 1/1996 | Kagawa et al. | 257/431 |
| 5,895,233 A | * | 4/1999 | Higashi et al. | 438/107 |
| 6,229,190 B1 | * | 5/2001 | Bryzek et al. | 257/419 |
| 6,335,559 B1 | * | 1/2002 | Charles | 257/620 |
| 6,346,742 B1 | * | 2/2002 | Bryzek et al. | 257/704 |
| 6,521,477 B1 | * | 2/2003 | Gooch et al. | 438/50 X |
| 2002/0029639 A1 | * | 3/2002 | Wagner et al. | 73/756 |
| 2003/0217915 A1 | * | 11/2003 | Ouellet et al. | 204/192.15 |

FOREIGN PATENT DOCUMENTS

DE    195 37 814    4/1997

* cited by examiner

Primary Examiner—Matthew Smith
Assistant Examiner—Victor Yevsikov
(74) Attorney, Agent, or Firm—Kenyon & Kenyon

(57) ABSTRACT

System and method for bonding a cap to a wafer. The method includes providing a wafer with an microelectromechanical system arranged thereon; providing a bond frame arranged on the outer perimeter of the wafer; and providing a transparent cap. A laser beam is projected through the transparent cap and impinges on the bond frame in a region adjacent to the transparent cap. The bond frame absorbs some or all of the laser energy and increases in temperature. The heat generated by the impinging laser beam is transferred from the bond frame to the adjacent cap, which is heated in excess of its melting temperature. The transparent cap melts in the region of the laser impinging on the bond frame and thereby bonds with the bond frame, creating a hermetic seal between the cap and the wafer. The MEMS sensor is thereby protected from the environment by the hermetically sealed cap. A MEMS device with an hermetically sealed cap or a BioMEMS device with a channel having rounded corners is provided. A system for creating hermetically sealed MEMS devices and/or BioMEMS devices having rounded channels is provided.

18 Claims, 3 Drawing Sheets

SI WAFER-CAP WAFER BONDING METHOD USING LOCAL LASER ENERGY, DEVICE PRODUCED BY THE METHOD, AND SYSTEM USED IN THE METHOD

FIELD OF THE INVENTION

The present invention generally regards the bonding of wafers to create microelectromechanical systems. More particularly, the present invention regards a method and system for bonding a silicon wafer to a cap wafer using a laser.

BACKGROUND INFORMATION

Sensor components may be manufactured using surface micromechanics, deposition, or etching technologies. Microelectromechanical systems (MEMS) are used for a variety of devices including oscillators, channels, pumps, accelerometers, and filters. To protect against external interference during operation, it may be desirable to hermetically seal the MEMS sensor structure with a cap. This sealing process may take place in a vacuum or under controlled atmospheric conditions. Capping is usually performed on the wafer level using a structured silicon or glass wafer. This cap wafer is designed so that it can be placed on the sensor wafer in an aligned manner.

Glass and silicon wafers have been bonded using anodic bonding techniques. Anodic bonding uses borate glass containing alkali ions (e.g., Borofloat, Pyrex) as the cap and a conductive or semi-conductive material as the bond frame (e.g. silicon). Anodic bonding requires good contact between the surface layers, and therefore requires smooth contact surfaces. Some mechanical compression is also required to provide a good contact between the layers. High temperatures, on the order of 300 to 500 degrees Celsius, and high voltages are required for successful anodic bonding. A charge is applied between the glass and the silicon to create a bond between the atoms at the interface between the different layers. One important disadvantage of anodic bonding is that thermally induced mechanical stress results from the heating of the different layers since the SI wafer and the glass wafer have different expansion coefficients. Another disadvantage of anodic bonding is that, due to the high electrostatic fields, the movable MEMS structures may stick during the bonding process or may have to be electrically insulated from the electrostatic fields.

Alternatively, glass frit bonding has been used to bond the cap wafer to the Si sensor wafer in a stable manner. Wafer bonding techniques such as glass frit bonding use special glasses that contain PbO and that soften at moderate temperatures. Glass frit bonding has the advantage that the topography of the contact surface and particles at the bonding interface have little effect. The disadvantages of glass frit bonding include crimping of the solder, the wide bonding interface required, the offset between the cap and wafer, outgassing from the bonding process, and the difficulty of further processing the object.

Another alternative bonding technique is silicon direct bonding, which may have the disadvantages that the topography of the contact surfaces must be very smooth and that any particles present at the contact surface weaken bond adhesion. Additionally, silicon direct bonding may require very high temperatures on the order of 700 to 1000 degrees Celsius.

Other bonding techniques are eutectic bonding or adhesion techniques such as gluing. These techniques are used for various applications. Major disadvantages of gluing include outgassing, poor alignment, poor durability, a large bonding area, and the difficulty of further processing the object.

Some important considerations when selecting the bonding technique are thermal mismatch between the sensor wafer, the cap wafer and the bonding medium used; the effect of topography and particles; the further processability of the combination; the bonding surface required for a stable bond; the emission of gases from the bonding medium; and special measures such as electrical shielding and the like. Therefore, there is a need for a method of consistently and reliably bonding a sensor wafer to a cap wafer to provide a hermetically sealed cap. Also desirable is a method of hermetically sealing a cap wafer to a silicon wafer that requires only a small area for the bonding area.

The use of lasers in manufacturing is spreading due to the abundance of different types of lasers that are available economically. For instance, aluminum may be welded during airplane production using localized laser energy.

Channels may be constructed as part of the production of Bio-MEMS (biological microelectromechanical systems). These channels may be used for the passage of fluids. In some bonding methods, the channel produced may have cavities at the interface between different layers. These cavities may allow dirt or impurities to corrupt a biological sample or distort a sensor measurement. Therefore, a method of bonding to produce a channel with rounded corners for use in Bio-MEMS or other applications may be desirable.

SUMMARY OF THE INVENTION

A system and method for bonding a glass wafer to a silicon wafer is provided that uses localized laser energy. In this method, a transparent cap wafer (e.g. glass or plastic) is transilluminated by a laser beam having a high power density while the cap wafer is aligned and in close contact with a silicon wafer. Only the cap wafer is transparent to the laser beam so that almost all the light is absorbed in the silicon wafer. As a result, the glass boundary layer melts in a localized manner and bonds with the silicon wafer. In one preferred focusing and guidance system, the laser is moved in discrete steps over the wafer such that narrow bonding traces (2 $\mu$m–100 $\mu$m in width) are formed from molten silicon in the bonding surfaces, and these traces hermetically enclose the sensor structure.

The method for creating a bond between a wafer and a cap includes providing the wafer with at least one microelectromechanical system and a bond frame arranged on the wafer. The bond frame is arranged on an outer perimeter of the wafer with respect to the at least one microelectromechanical system and has a high absorption coefficient with respect to a laser beam wavelength. A cap with a low absorption coefficient with respect to the laser beam wavelength is arranged on top of the wafer. The laser beam is projected through the cap and impinges on the bond frame thereby heating the bond frame. A portion of the cap adjacent to the bond frame is melted creating a bond between the cap and the bond frame.

A device is provided including a wafer, at least one microelectromechanical system, a bond frame, and a cap. The cap is bonded to the bond frame by a laser beam projected through the cap and impinging on the bond frame and heating the bond frame. The heat from the bond frame melts the cap which forms a bond with the bond frame.

A system for bonding a wafer to a cap is provided with a holder which applies a normal force to the wafer and the cap and which has an aperture for the laser beam. Also included is a laser directed at the aperture and projecting at a frequency that passes through the aperture with about zero absorption. The laser beam passes through the cap and impinges on the wafer, thereby heating the wafer and causing the cap to bond to the wafer.

DETAILED DESCRIPTION

Figure 1:
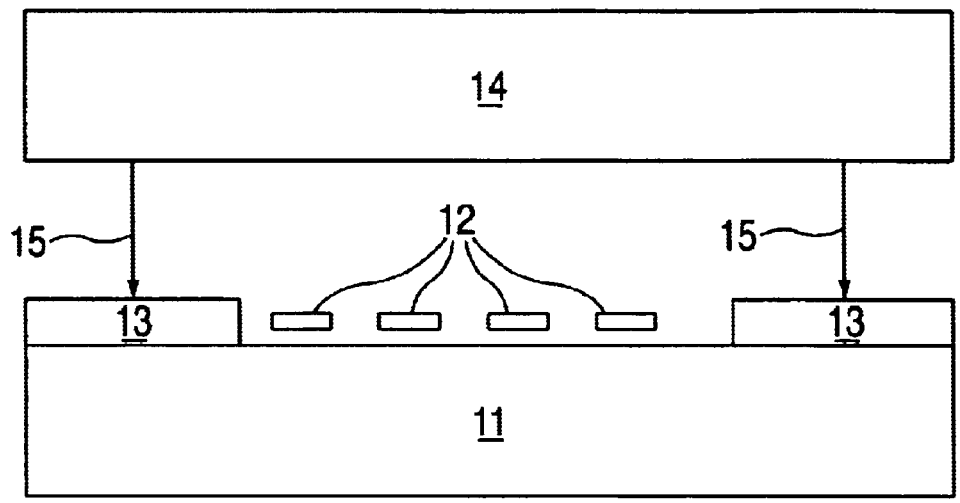
FIG. 1 illustrates a cross-sectional view of a microelectomechanical structure arranged on a silicon wafer showing a cap wafer suspended above the wafer.
Figure 2:
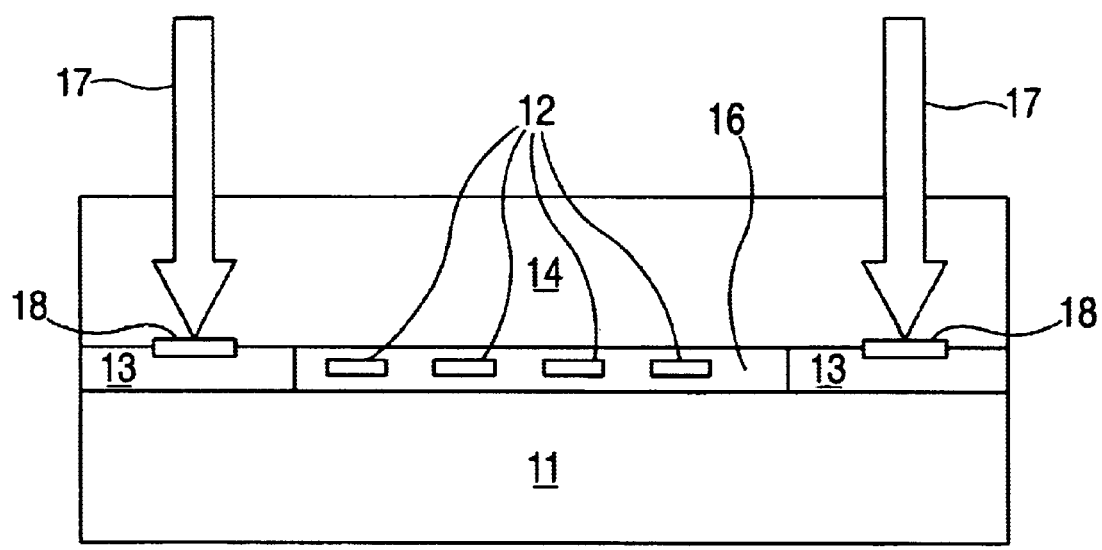
FIG. 2 illustrates a cross-sectional view of the microelectromechanical structure of FIG. 1 after bonding to create a hermetical seal and illustrating the laser beams used to create the bonds.

The method of the present invention for bonding two wafers is shown schematically in FIGS. 1 and 2. In this example, the bonding technique according to the present invention is used to hermetically cap sensor components which have been constructed using surface micromechanics, etching, or deposition technology. FIG. 1 shows a cross-sectional view of Wafer 11 upon which is arranged, on a top side in the center, Sensor Structures 12. Sensor Structures 12 may be an oscillator, channel, pump, accelerometer, filter, or any other appropriate MEMS structure and may be of any appropriate shape and/or size. Sensor Structures 12 may be composed of silicon single crystals, silicon poly crystals, metal, galvanic material (e.g. zinc or silver), silicon germanium, plastic, or any other appropriate material. Sensor Structures 12 may be constructed by any appropriate micromachining method, including methods utilizing vapor deposition and etching techniques. In particular, chemical vapor deposition (CVD) may be utilized, including laser-assisted CVD (LCVD), plasma-activated CVD (PACVD), electron-assisted CVD (EACVD), and electron beam induced CVD (EBCVD). Also physical vapor deposition (PVD) may be utilized, including electron beam PVD (EBPVD).

Also arranged on the top side of Wafer 11, on both sides of Sensor Structure 12, is Bond Frame (or bond ring) 13. Not illustrated in FIG. 1 due to the cross-sectional nature of the drawing is that Bond Frame 13 forms a continuous circumference around Sensor Structure 12. Bond Frame 13 may be made in any appropriate shape or size. It may also be advantageous if the top surface of Bond Frame 13 is smooth to facilitate formation of a bond with Cap 14. Wafer 11 may be composed of silicon, or may be made of any other appropriate material. Sensor Structure 12, and/or Bond Frame 13, may also be composed of silicon or any other appropriate material. Sensor Structure 12 and/or Bond Frame 13 may be deposited on Wafer 11 using traditional deposition techniques, or by any alternative construction technique. Sensor Structure 12 may be a structure designed to filter, oscillate, measure pressure, or any other function appropriate for a microelectromechanical system. It may be advantageous for the operation of Sensor Structure 12 that it operate in vacuum, near vacuum, or in a specific gas and/or at a specific pressure. Therefore, it may be advantageous that Sensor Structure 12 be hermetically sealed with a cap.

Cap 14 is shown in FIG. 1 positioned above Wafer 11 in alignment with Wafer 11. Arrows 15 show the direction in which Cap 14 is moved in order to bring it into contact with Bond Frame 13. One advantage of the technique described herein is that the area available in Bond Frame 13 to form a bond with Cap 14 is smaller than the surface necessary for alternative bonding techniques. A smaller surface area of Wafer 11 dedicated to Bond Frame 13 means that Sensor Structure 12 may be larger, or that Wafer 111 may be smaller. Another advantage is that the technique describe herein is effective even with surface imperfections and irregularities on the contact areas between Bond Frame 13 and Cap 14. Cap 14 may be made of any material transparent with respect to the laser wavelength selected. Typical laser wavelengths are in the range of 900 to 1200 nanometers, and may preferably be 1100 nanometers. Cap 14 may be composed of glass, plastic, or any other appropriate transparent material. In one embodiment Cap 14 is composed of glass with a melting temperature of more than 200 degrees Celsius, and preferably a melting temperature of between 400 and 800 degrees Celsius. Bond Frame 13 may be composed of silicon, and may have a melting temperature of about 1200 degrees Celsius. Therefore, as Laser Beams 17 impinge on Bond Frame 13 and consequently heat Bond Frame 13, the temperature rises to between 400 and 800 degrees Celsius, and then the glass melts. This may provide a sufficient bond and therefore the Laser Beams 17 would be scanned to different regions to heat up different regions of Bond Frame 13. Alternatively, Laser Beams 17 may continue to impinge on Bond Frame 13 until the temperature of Bond Frame 13 reaches about 1200 degrees Celsius, at which time Bond Frame 13 also melts. Melting both Bond Frame 13 and Cap 14 may provide a more effective hermetic seal.

FIG. 2 shows the arrangement of FIG. 1 after Cap 14 has been positioned in contact with Bond Frame 13. Cap 14 may be positioned so that Cavity 16 formed by Wafer 11, Bond Frame 13, and Cap 14 completely encloses Sensor Structure 12. In this situation, Cap 14 lies above a top edge of Sensor Structure 12. Wafer 11 may preferably be made of a material with similar thermal expansion properties to the material of Cap 14. It may also be advantageous if Wafer 11 and Cap 14 are well-matched with respect to being processed using a diamond saw (interior compass saw or wire saw), to facilitate post-bonding processing. Both Wafer 11 and Cap 14 may also include one or more structures made of silicon, oxide, nitride, metal or any other appropriate material.

In the present invention, one or more layers are applied to Wafer 11 to create Bond Frame 13. Bond Frame 13 can then be brought very near to, or in contact with, Cap 14 in the area of the bonding site. Bond Frame 13 is made of one or more materials having a higher absorption coefficient than the material of Cap 14.

The bonding of Cap 14 to Wafer 11 may take place in a vacuum, near-vacuum or any other controlled environment. Therefore, any appropriate gas may be present, at any appropriate pressure, to enable the MEMS to operate more efficiently.

FIG. 2 shows Wafer 11 in contact with Cap 14 through Bond Frame 13, or within a distance of a few $\mu$m. Laser Beams 17, having a high power density and a wavelength which will not be absorbed by Cap 14, are directed at the aligned compound wafer in the direction of the arrows indicated on Laser Beams 17. Laser Beams 17 are routed along the bond areas around Bond Frame 13 at a scan rate (i.e., writing speed) of between 10 mm/s and 1000 mm/s. Either Laser Beams 17 may be scanned along Bond Frame 13 while the wafer stack remains immobile, or the wafer stack may move on an x-y table (not shown) while Laser Beams 17 either remain immobile or simultaneously move. The width of the bonding trace may be determined by the width of Laser Beams 17, and may be as small as several micrometers wide (e.g., 2 to 20 micrometers). Laser Beams 17 may advantageously be high powered (e.g., 1 to 50 watts) to enable fast writing speeds. Additionally, multiple lasers (not shown) may be "ganged" in order to create Laser Beams 17, and to thereby increase the production speed.

It may be necessary in this process to know the position of the bonding surfaces with respect to the laser beam. An infrared transmission alignment method may be used for this purpose, for example. Virtually no luminous power is absorbed in Cap 14 due to the selection of the laser wavelength. Almost all the luminous power of Laser Beams 17 are absorbed in Bond Frame 13. This absorption generates heat which locally melts Bond Frame 13 and/or Cap 14. Melting Bond Frame 13 and/or Cap 14 creates Bond 18. Bond 18 may therefore provide an hermetic seal for Sensor Structure 12 by completely surrounding Sensor Structure 12. Wafer 11 and Cap 14 may be arranged in a holder (not shown) that would ensure proper alignment of Wafer 11 and Cap 14. Additionally, the holder might provide some pressure at the interface between Bond Frame 13 and Cap 14. The holder might be transparent with respect to the wavelength of Laser Beams 17, or the holder might be opaque or reflective with respect to the wavelength of Laser Beams 17. If the holder is opaque or reflective, then the holder may provide an aperture through which Laser Beam 17 is projected. This aperture of the holder may ensure that Laser Beams 17 are projected at only a central, target region of Bond Frame 13 to create Bond 18 (or a bond trace). This aperture may therefore prevent errant or accidental lasing of regions of either Bond Frame 13, Wafer 11, or Sensor Structure 12 that are not intended to be bonded. This aperture may additionally include optics used to align and/or focus Laser Beams 17.

Melting Bond Frame 13 and/or Cap 14 creates Bond 18 between Bond Frame 13 and Cap 14. Due to the controllable nature of the laser, Bond 18 may be localized, reducing the area requirements for Bond Frame 13. The localized nature of Laser Beam 17 also reduces the stress that may result from heating the adjacent layers (Bond Frame 13 and Cap 14) if the layers are made of materials with different thermal expansion coefficients. The width of Bond 18 is defined by the width of Laser Beam 17, which may be as small as several micrometers (e.g. 2 to 20 micrometers). Bonding with Laser Beam 17 may avoid some of the problems associated with anodic bonding including sticking of the MEMS structures due to exposure to high voltages, or the necessity to shield the MEMS structures to prevent sticking.

Figure 3:
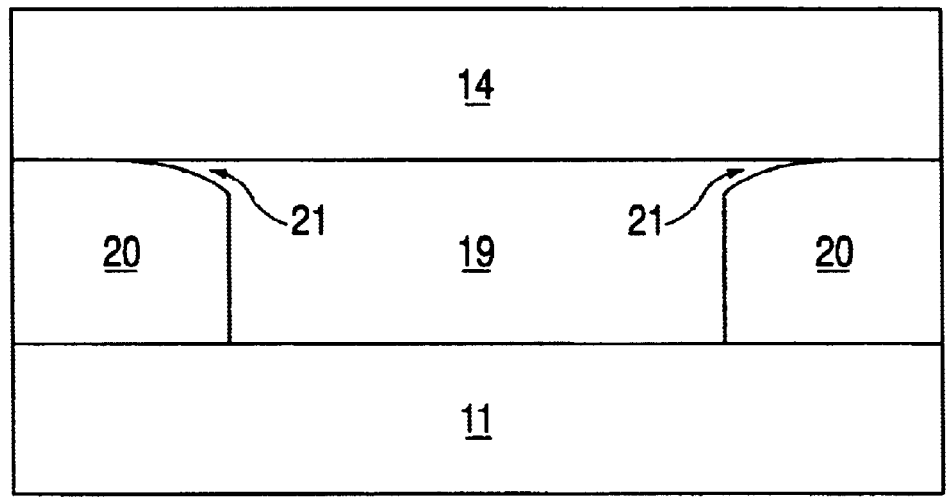
FIG. 3 illustrates a cross-section of a channel created using traditional bonding techniques.

FIG. 3 shows a cross-sectional view of a channel, for example a channel used in a Bio-MEMS, constructed by traditional methods, for instance anodic bonding. Channel 19 is created by bonding Wafer 11, having Sidewalls 20, to Cap 14. Wafer 11 and Sidewalls 20 may be made of any appropriate material, including silicon. Sidewalls 20 may be constructed on Wafer 11 using any appropriate micromachining technique, deposition, and/or etching. Similarly, Cap 14 may be made of any appropriate material, including glass or plastic. Traditional bonding techniques used to construct Channel 19 shown in FIG. 3 result in Gaps 21 in the corners of Channel 19 between the bonded layers (Sidewalls 20 and Cap 14). Gaps 21 provide a space for the collection of contaminants and impurities when fluids pass through Channel 19. Therefore, the presence of Gaps 21 may lead to either deteriorating performance for the BioMEMS (or other device utilizing Channel 19) or to the necessity of increasing efforts (measured in time and/or costs) to decontaminate and/or clean Channel 19.

For instance, BioMEMS may be used to test for enzymes by coding the enzymes with a molecular marker, then conditioning Channel 19 with a molecule that reacts with the molecular marker, then passing the enzymes through Channel 19. Depositing coded enzymes on Sidewalls 20 of Channel 19 provides an opportunity to observe the enzymes. Therefore, for purposes of viewing only, and not with respect to the construction technique described herein, any of Wafer 11, Sidewalls 20, or Cap 14 may be transparent to enable viewing of any enzymes or other chemical markers deposited on Sidewalls 20 of Channel 19.

Another application in which channels with smooth corners may be advantageous include ink jet printer heads. Ink jet printer heads use nozzles, holes, and channels, any of which may be subject to contamination by impurities if the sidewall junctions have cracks or crevices. Bonding Sidewalls 20 of Channel 19 (or alternatively, bonding sidewalls of nozzles) using localized laser energy provides rounded corners which may be more suitable to the unimpeded flow of ink or any other appropriate fluid.

Figure 4:
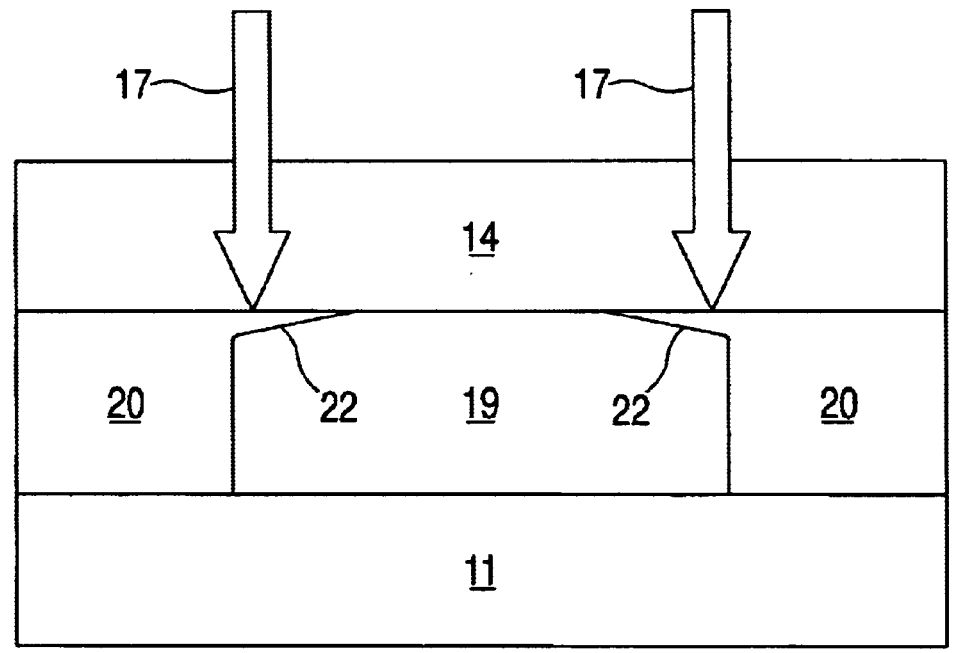
FIG. 4 illustrates a cross-section of a channel created using laser beams to create the bond between the cap and the sidewalls.

FIG. 4 shows a BioMEMS channel similar to that shown in FIG. 3, except that Gaps 21 have been replaced with Rounded Corners 22. The transformation from the channel shown in FIG. 3 to that shown in FIG. 4 is accomplished by illuminating the junction between Sidewalls 20 and Cap 14 in the vicinity of Gaps 21. Laser Beams 17 show the position and direction of laser illumination, which may be directed at the surface between Sidewalls 20 and Cap 14. Cap 14 should therefore be transparent, or have a very low absorption coefficient, in order for Laser Beams 17 to pass through Cap 14 with little or no absorption. Sidewalls 20 should have a high absorption coefficient with respect to the wavelength of Laser Beams 17 so that the energy of Laser Beams 17 may be absorbed and the material of Sidewalls 20 and/or Cap 14 heated. Heating Sidewalls 20 and/or Cap 14 to melting temperature enables the two materials to bond with one another in the junction between Sidewalls 20 and Cap 14 in an area adjacent to Channel 19. The melting of Sidewalls 20 and/or Cap 14 by Laser Beams 17 creates Rounded Corners 22 due to the surface tension in the melted material. Rounded Corners 22 may be advantageous because they do not provide an area for dirt or other impurities to collect. Therefore, Channel 19 may be more likely to remain in a clean, uncontaminated, condition.

In order that a minimum of the luminous power of the laser is absorbed in Cap 14, the wavelength of the laser must be selected so that it is not absorbed by the material used to make Cap 14. When using glass as the first material, the laser wavelength must be greater than approximately 600 to 800 nanometers. In this case, it must be taken into consideration that the absorption coefficient is a function of temperature. When heated, absorption in the material shifts to higher wavelengths so that, following initial transparency, considerable absorption may occur in the material of Cap 14. To ensure that the bonding area between Cap 14 and Bond Frame 13 (or Cap 14 and Sidewalls 20) heats sufficiently, and to ensure that the wafers are welded to one another, Bond Frame 13 (or Sidewalls 20) must be sufficiently illuminated by the laser beam. However, when Cap 14 is heated, much of the power may be absorbed in Cap 14 if the laser wavelength is chosen too close to the threshold of the absorption edge. The wavelength may be selected to be as far as possible away from the absorption edge of Cap 14 while being as close as possible to the absorption edge of Bond Frame 13 (or Sidewalls 20) that is to be used as the absorbing layer. If metal is used as Bond Frame 13 (or Sidewalls 20), there may be no critical limit of the laser wavelength since the metal may absorb within very broad bands of the infrared spectrum. When using semiconducting materials, the wavelength of the laser may be limited. The use of SiGe layers or superlattice structures for absorption may reduce the upper wavelength limit in this situation.

A device created by the exemplary embodiment of the present invention described above or in alternative embodiments may be compatible with Complementary Metal Oxide System (CMOS) semiconductors. The method according to the present invention may also be compatible with bonding of materials, or within the vicinity of materials, that have a low tolerance for temperature fluctuations. In particular, materials and coatings that cannot withstand high temperatures may be compatible with the method according to the present invention, such as self-assembled mono layers used either to avoid sticking or to condition the surface of the channel in a BioMEMS.

Due to the low temperature requirements of the method according to the present invention, a greater range of gases and pressures may occupy Cavity 16. This includes the possibility for vacuum and near vacuum encapsulation.

Figure 5:
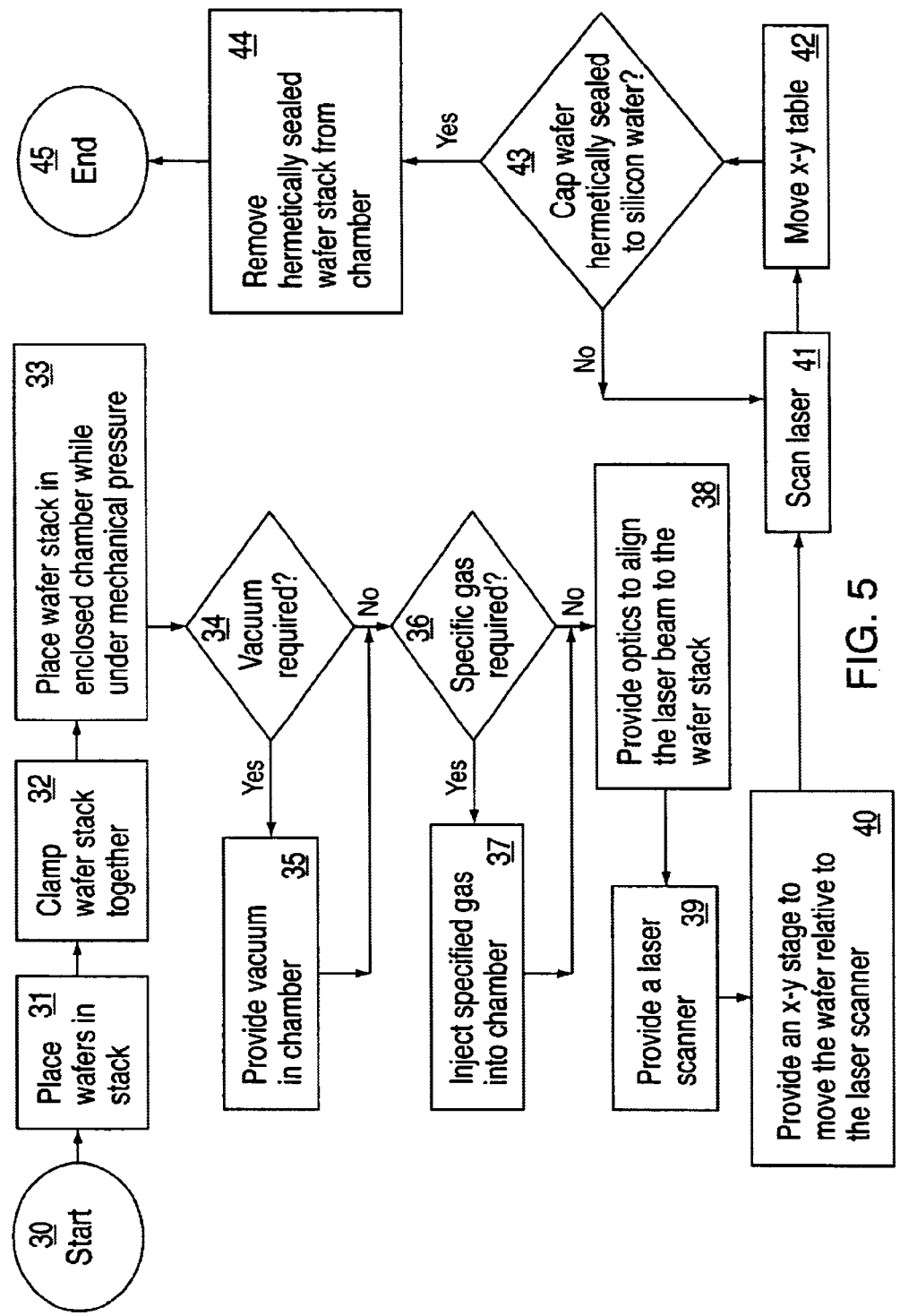
FIG. 5 shows a flow chart illustrating a method according to the present invention.

FIG. 5 shows a flow chart illustrating a method according to the present invention. From start Circle 30, the flow proceeds to Box 31, where the wafers are placed in a stack. As noted above, the wafers may include a silicon wafer upon which are constructed MEMS and having a bond frame arranged on an outer perimeter. The wafers may also include a cap wafer, which may be composed of any appropriate transparent material, and which may be arranged on top of the silicon wafer so that the cap wafer is in contact with the bond frame of the silicon wafer. Box 32 indicates that the wafer stack is clamped together to—provide a mechanical pressure at the interface between the cap wafer and the silicon wafer. In Box 33, the wafer stack is enclosed in a chamber while still under mechanical pressure. The chamber may be any appropriate chamber and may be integrated with the device applying the mechanical pressure to the wafer stack. The chamber may be hermetically sealed and may provide a controlled environment in which to bond the wafer stack. Diamond 34 asks whether vacuum is required for the processing of the wafer stack. Vacuum may be desired due to the specific requirements of the MEMS being constructed, and may be a high or low vacuum. Vacuum is provided in Box 35 by evacuating the chamber before bonding the wafer stack, if required. Diamond 36 asks whether a specific gas is required. The method according to the present invention enables a broader range of gases to be hermetically sealed in the wafer stack due to the limited temperature range necessary to bond the cap wafer to the silicon wafer using localized laser energy rather than traditional bonding techniques. In Box 37 a specified gas is injected into the chamber. Box 38 provides optics to align the laser beam to the wafer stack. These optics may be wholly or partially integrated in the chamber to allow the laser beam to be positioned outside the chamber while projecting the laser beam into the chamber at the wafer stack placed inside. Box 39 provides a laser scanner which projects a laser beam which has a wavelength that is not absorbed by the cap wafer. Box 40 provides an x-y stage to move the wafer relative to the laser scanner to ensure that the localized laser energy of the laser beam is projected on the entire perimeter of the bond frame. Box 41 scans the laser and Box 42 moves the x-y table to thereby bond the cap wafer to the silicon wafer and hermetically seal the MEMS arranged on the silicon wafer. Diamond 36 asks whether the cap wafer is hermetically sealed to the silicon wafer. If the answer is no, then the process moves back to Box 41, in which the laser is scanned, and from there to Box 42, in which the wafer stack is moved on the x-y table. If the answer to the question presented in Diamond 36 is yes, then the process moves to Box 44 in which the hermetically sealed wafer stack is removed from the chamber. The flow ends in Circle 45.

Specific applications of the method according to the present invention include wafer level packaging of inertial sensors, pressure sensors, BioMEMS, optical MEMS for telecommunications (e.g. optical switches, modulators), and inkjet printer heads, as well as numerous other applications.

A system that can implement the method of the present invention may have some or all of the following characteristics: an alignment unit for setting the laser position with reference to the microelectromechanical system; an alignment unit for precisely positioning the wafer and cap with respect to one another; a wafer holder for fixing the wafer alignment so that there is optical access for the laser beam over the entire wafer area; a laser source having adequate power (for instance possibly greater than 1 watt of optical power) and suitable wavelength; a scan unit for deflecting the laser beam over the wafer; a shutter for masking/releasing the laser power; possibly a hermetically sealed process chamber for providing a specific gas atmosphere at a specific gas pressure during the welding procedure; an image recognition apparatus for checking process progress; and possibly a sample holder with a cooling or heating apparatus.

What is claimed is:

1. A method for creating a bond between a wafer and a cap, comprising:

providing the wafer, at least one microelectromechanical system arranged on the wafer and a bond frame arranged on the wafer, the bond frame arranged on an outer perimeter of the wafer with respect to the at least one microelectromechanical system, the bond frame having a high absorption coefficient with respect to a wavelength of a laser beam;

providing the cap arranged on top of the wafer, the cap having a low absorption coefficient with respect to the wavelength of the laser beam; and projecting the laser beam through the cap, the laser beam impinging on the bond frame, the laser beam heating the bond frame, wherein a portion of the cap adjacent to the bond frame is melted.

2. The method according to claim 1, wherein:

the wafer includes a first material;

the bond frame includes a second material; and an absorption coefficient of the first material is about equal to an absorption coefficient of the second material.

3. The method according to claim 2, wherein the first material is the same as the second material.

4. The method according to claim 1, wherein the laser beam has a wavelength of about 900 nanometers to 1200 nanometers.

5. The method according to claim 4, wherein the laser beam has a wavelength of about 1100 nanometers.

6. The method according to claim 1, wherein the laser beam is able to pass through the cap with about zero absorption.

7. The method according to claim 6, wherein the cap includes at least one of glass and plastic.

8. The method according to claim 6, wherein the laser beam is about totally absorbed by the bond frame.

9. The method according to claim 8, wherein the laser beam impinging on the bond frame causes at least one of a bond frame temperature to increase and a wafer temperature to increase.

10. The method according to claim 9, wherein:
the laser beam impinging on the bond frame causes at least one of the bond frame temperature and the wafer temperature to exceed about 400° Celsius;
a heat from at least one of the bond frame and the wafer is transferred to the cap; and
a cap temperature exceeds a cap material melting point.

11. The method according to claim 10, wherein at least one of:
the bond frame temperature exceeds a bond frame material melting point; and
the wafer temperature exceeds a wafer material melting point.

12. The method according to claim 11, wherein the laser beam impinging on the bond frame causes at least one of the bond frame temperature and the wafer temperature to exceed about 1200° Celsius, thereby melting at least one of the cap, the wafer, and the bond frame.

13. The method according to claim 9, wherein the laser has a power in the range of about 1 watts to about 50 watts.

14. The method according to claim 13, wherein the laser is able to heat the wafer to melt the cap with a speed allowing the laser to move at a rate of between about 10 millimeters per second and about 1000 millimeters per second.

15. The method according to claim 1, wherein the laser beam has a cross-sectional diameter in the range of about 2 micrometers to about 20 micrometers.

16. The method according to claim 15, wherein the laser beam causes the wafer to heat up in a localized area equal to about the size of a cross section of the laser beam.

17. The method according to claim 1, further comprising projecting a second laser beam through the cap, the second laser beam impinging on the bond frame, the second laser beam heating the bond frame.

18. The method according to claim 1, wherein:
the at least one microelectromechanical system includes a channel;
the bond frame includes a sidewall, the sidewall adjacent to the channel;
the laser beam impinges on the bond frame in a portion of the sidewall adjacent to the cap, the laser beam heating the sidewall; and
an interface between the sidewall and the cap is filled when the cap melts.

* * * * *